United States Patent [19]

Yeh

[11] 4,304,042
[45] Dec. 8, 1981

[54] SELF-ALIGNED MESFETS HAVING REDUCED SERIES RESISTANCE

[75] Inventor: Keming W. Yeh, Los Angeles, Calif.

[73] Assignee: Xerox Corporation, Stamford, Conn.

[21] Appl. No.: 171,617

[22] Filed: Jul. 23, 1980

Related U.S. Application Data

[62] Division of Ser. No. 959,963, Nov. 13, 1978, abandoned.

[51] Int. Cl.³ ............................................. H01L 21/26
[52] U.S. Cl. ................................... 29/571; 29/576 B; 148/1.5; 148/187; 357/15; 357/22
[58] Field of Search ............... 29/571, 576 B; 148/1.5, 148/187; 357/15, 22

[56] References Cited

U.S. PATENT DOCUMENTS

| | | | |
|---|---|---|---|
| 3,899,372 | 8/1975 | Esch et al. | 148/187 |
| 4,023,195 | 5/1977 | Richman | 357/23 |
| 4,111,725 | 9/1978 | Cho et al. | 148/175 |
| 4,160,987 | 7/1979 | Dennard et al. | 357/41 |
| 4,183,040 | 1/1980 | Rideout | 29/571 X |
| 4,204,894 | 5/1980 | Komeda et al. | 148/188 |
| 4,215,356 | 7/1980 | Kato | 357/22 |
| 4,235,011 | 11/1980 | Butler et al. | 29/571 |
| 4,253,229 | 3/1981 | Yeh et al. | 29/578 X |

OTHER PUBLICATIONS

IBM Technical Disclosure Bulletin, vol. 9, No. 10, Mar. 1967, pp. 1470 and 1471.

*Primary Examiner*—G. Ozaki

[57] ABSTRACT

Disclosed herein is a structure and process for a self-aligned metal semiconductor field effect transistor having the characteristics of a high speed, high density, low power LSI circuit and specifically an improved high device gain MESFET device using conventional photographic techniques. The inventive MESFET device has improved high device gain as a result of the elimination of series resistance, increased circuit integration density, and improved speed capability due to the elimination of spacings between gate and drain and gate and source and the improved high device gain.

11 Claims, 11 Drawing Figures

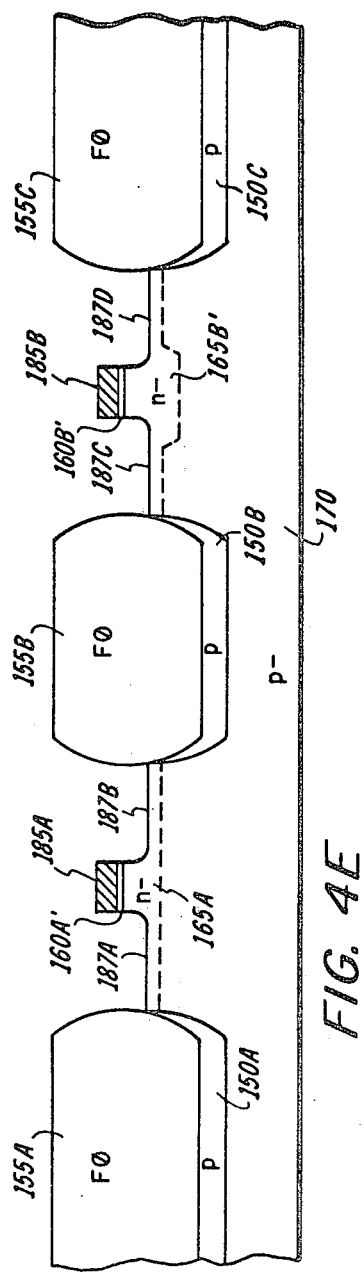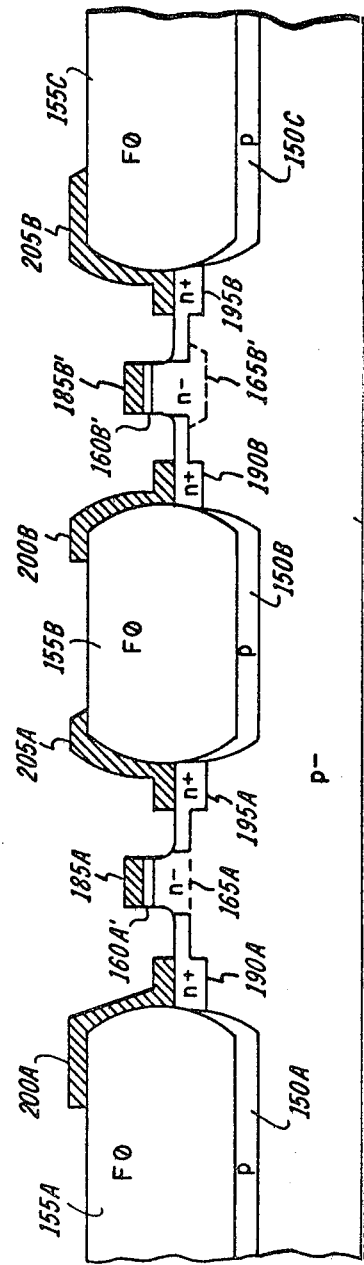

SELF-ALIGNED MESFETS HAVING REDUCED SERIES RESISTANCE

CROSS REFERENCE TO RELATED APPLICATION

This is a division of application Ser. No. 959,963, filed Nov. 13, 1978.

A patent application entitled "Self-Aligned Narrow Gate MESFET Process" bearing application No. 900,635 and filed on Apr. 27, 1978, now U.S. Pat. No. 4,253,229 by Keming Yeh et al and assigned to Xerox Corporation describes and claims a MESFET upon which the present invention is an improvement thereon.

BACKGROUND OF THE INVENTION

A. Field of the Invention

This invention relates to FET semiconductors and more particularly to a process and structure for a self-aligned MESFET having reduced series resistance.

B. Description of the Prior Art

Although MESFET's have high device gain relative to MOSFET's and do not require a thin gate oxide which limits the ultimate advancement of MOS devices, MESFET devices have been relatively unnoticed in the past as a result of their large series source and drain resistances which tend to degrade the actual device gain more severely than MOSFET devices. MESFET structures would only become attractive if the series resistance could be reduced by advanced photolithographic techniques which have not been well developed for practical use. Therefore, it is highly desirable to devise means to minimize these undesirable resistances in MESFET structures without requiring advanced photolithographic techniques to thus make MESFET's competitive with MOSFET's.

SUMMARY OF THE INVENTION

It is accordingly an object of the present invention to fabricate a high speed, high density, low power LSI circuit with improved high gain self-aligned MESFET devices using conventional photographic techniques.

An additional object is to provide a MESFET with improved high device gain as a result of elimination of series resistances.

Yet another object is to provide a MESFET with increased circuit integration density.

An additional object is to provide a MESFET with improved speed capability due to the improved high device gain.

BRIEF DESCRIPTION OF THE DRAWINGS

FIG. 4A–H shows the processing steps involved in creating a self-aligned MESFET structure having reduced series resistance as shown in FIG. 1.

DETAILED DESCRIPTION OF THE PREFERRED EMBODIMENT

Figure 1:
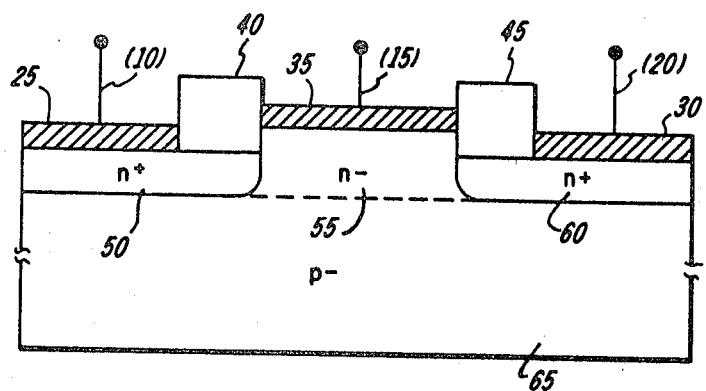
FIG. 1 is a cross-sectional view of a self-aligned MESFET device having reduced series resistance.

In FIG. 1 we see a self-aligned MESFET cross-sectional view as claimed including a source electrode 16, gate electrode 15 and drain electrode 20. The ohmic contacts for the source electrode 10 and drain electrode 20 are of polysilicon (poly) or platinum-silicon compound 25 and 30 respectively. The Schottky gate contact 35 is composed of a reacted platinum-silicon compound. Separating the source ohmic contact 25 from the gate Schottky contact 35 is a field oxide barrier of silicon dioxide 40. Likewise, separating the Schottky gate contact 35 from the drain ohmic contact 30 is a field oxide barrier of silicon dioxide 45. Underneath the oxide barrier 40 and the source electrode contact 25 is a N plus (+) conductive source region or area 50 implanted using the heavy dopant arsenic. Likewise, under the Schottky gate contact 35 is a N minus (−) gate channel region or area 55 implanted using the dopant arsenic. Finally, under the oxide barrier 45 and the drain ohmic contact 30 is an N plus (+) conductive drain region or area 60 implanted using the heavy dopant arsenic. It will be noted that the Schottky contact 35 is disposed to be stepped-up and over the N− gate channel region 55 relative to the N+ source and drain conductive regions 50 and 60 thereby allowing the silicon dioxide areas 40 and 45 to electrically isolate the contact 15 from the regions 50 and 60. This isolation allows the contact 15 to function effectively as a Schottky barrier. All the supra being supported by a P minus (−) or Pi substrate 65. It will be further noted that the $R_s$ or source resistance and the $R_D$ or drain resistance approximate zero in the self-aligned MESFET and as such is not shown as it is in infra FIG. 2 prior art.

Figure 2:
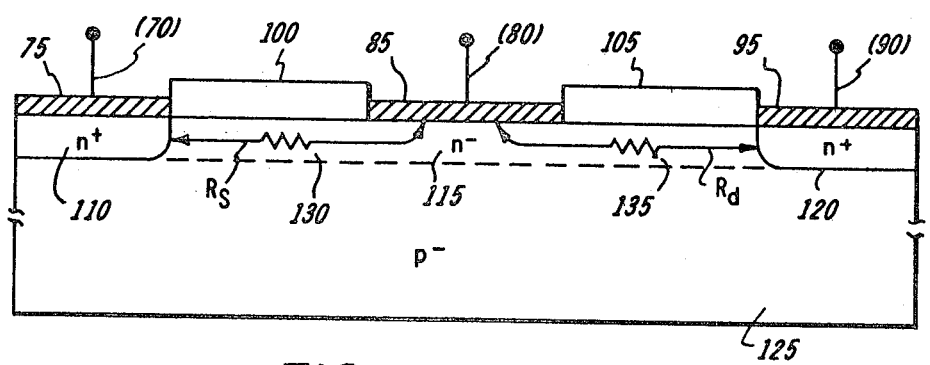
FIG. 2 is a cross-sectional view of a conventional MESFET prior art device.

In FIG. 2 prior art there is shown a source electrode 70 connected to an ohmic contact 75 of polysilicon or platinum-silicon compound, a gate electrode 80 connected to a Schottky contact 85 composed of a platinum silicon compound, a drain electrode 90 connected to an ohmic contact 95 of polysilicon or platinum-silicon compound. Interposed between the source ohmic contact 75 and the Schottky gate contact 85 is a silicon dioxide barrier 100 and likewise disposed between the Schottky gate contact 85 and the drain ohmic contact 95 is also a silicon dioxide barrier 105. In the conductive channel region is a N plus (+) area 110 below the ohmic source contact 75, an N minus (−) area 115 below the silicon dioxide barriers 100 and 105 and the Schottky gate contact 85, and an N plus (+) area 120 beneath the ohmic drain contact 95. Supporting all the above is a P minus (−) substrate 125. It will be noted that the source resistance Rs is shown as 130 and the drain resistance $R_D$ is shown as 135 and is relatively substantial as compared to that of the inventive self-aligned MESFET of FIG. 1.

Figure 3:
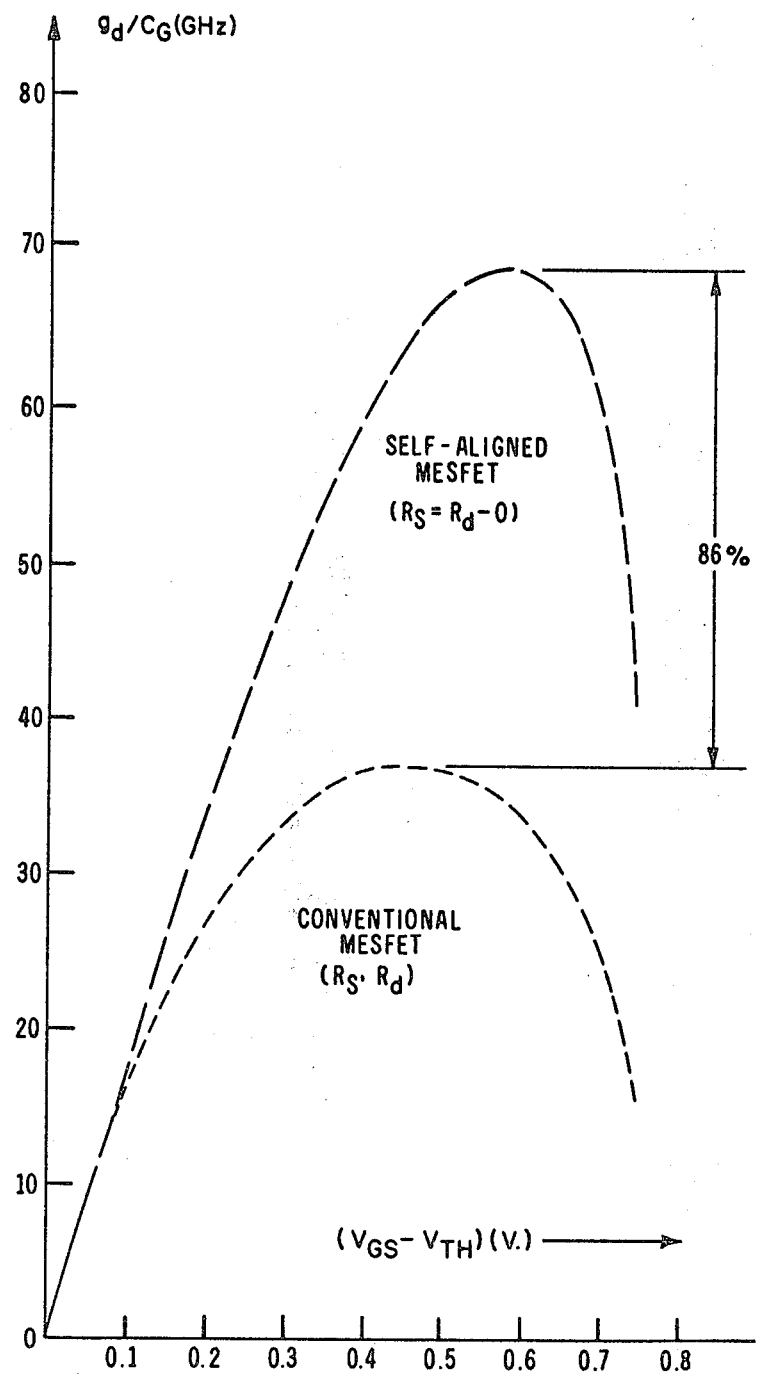
FIG. 3 is a diagram comparing the degradation effects of source resistance and drain resistance on a self-aligned MESFET of FIG. 1 and a conventional prior art MESFET of FIG. 2.

Referring to FIG. 3, there is shown the comparison of the degradation effect of source resistance Rs and drain resistance $R_D$ on a MESFET, $(g_d/c_g)$ where $g_d$ is device gain and $c_g$ is gate capacitance. The Y coordinate of FIG. 3 is $g_d/c_g$ (GHZ) which represents the high speed or high frequency capability of the device and the X coordinate is (Vgs-Vth) where Vgs is the gate source voltage and Vth is the threshold voltage. It will be noted that the $g_d/c_g$ is 86 percent higher in the self-aligned MESFET (where RS=RD=0) than the conventional prior art MESFET.

The cross referenced application, U.S. Ser. No. 900,635, now U.S. Pat. No. 4,253,229 shows and described the conventional process required to get to the structural state shown in FIG. 4A. In particular, the self-aligned MESFET process having double-layer interconnections comprises the following detailed steps. It should be noted as indicated supra that in the proposed fabrication process, an enhancement switching device and the depletion load device (basic inverter building block) are fabricated simultaneously. The enhancement switching device is indicated as the E switch 140 and the depletion load device is indicated as the D-load 145.

Figure 4A:
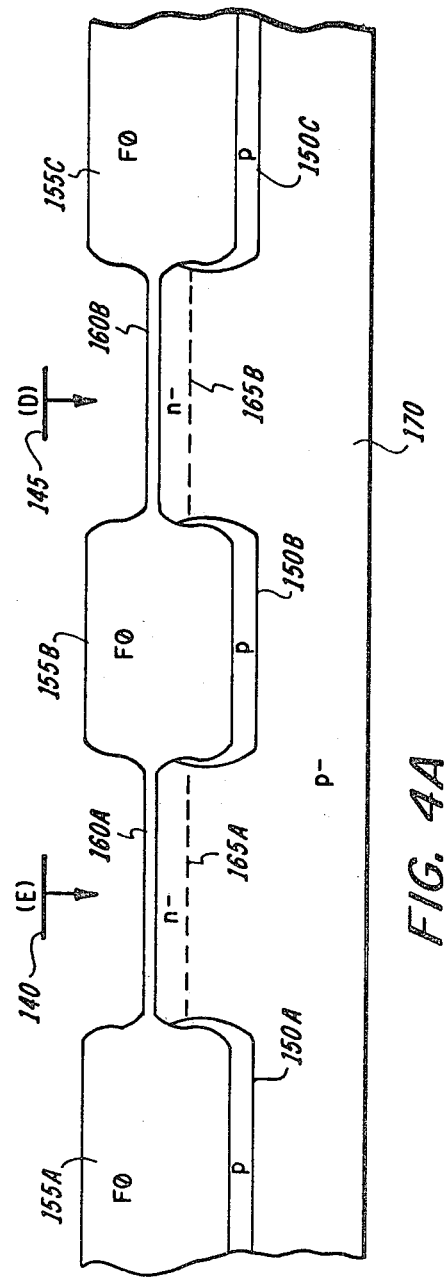
Figure 4B:
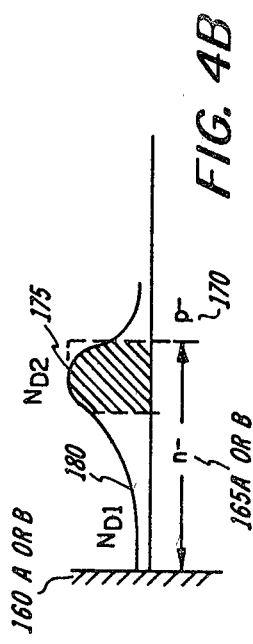

In the first step as shown in FIG. 4A, an acceptor minus (P— or Pi) substrate 170, is overlaid with thick field oxidation or relatively thick areas 155A–C of field oxide alternating with thin areas 160A–B of field oxide with acceptor (P) implants 150A–C, or introduced by other means, underlying the thick oxide 155A–C to prevent undesirable field inversion. The dopant arsenic is implanted, or introduced by other means, as an impurity through a 400A thin oxide or area of relatively thin oxide 160A–B to form the light donor or N— areas 165A–B. It will be noted that the light donor or N— layer 165A–B has a graded doping profile, as shown in FIG. 4B, where the device behaves similarly to a two step channel-doping MESFET. The main conduction channel ND2(175) is at the bottom layer where doping is the heaviest and the lighter doping being at ND1 (180).

Figure 4C:
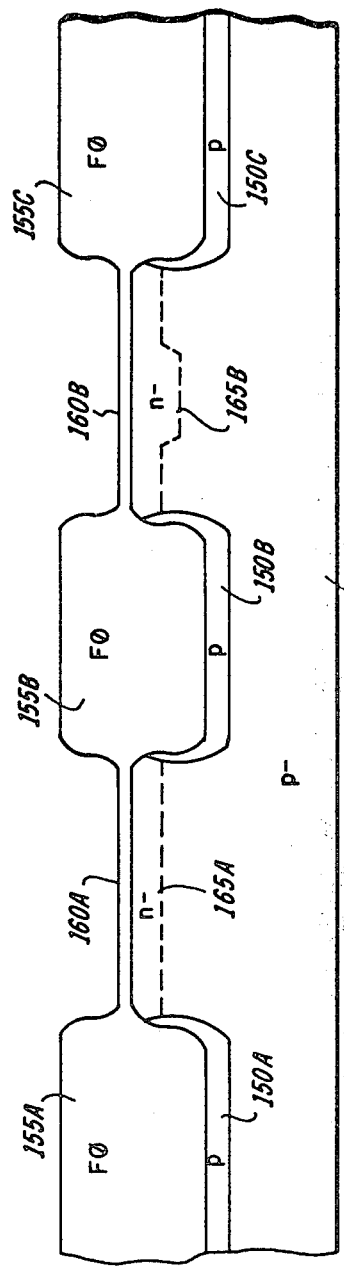

In the second step, as shown in FIG. 4C, a depletion mask is operative to expose the depletion device 145 for a relatively deep donor (N—) or arsenic implant, or introduced by other means, shown as 165B' to make a normally-on load device 145.

Figure 4D:
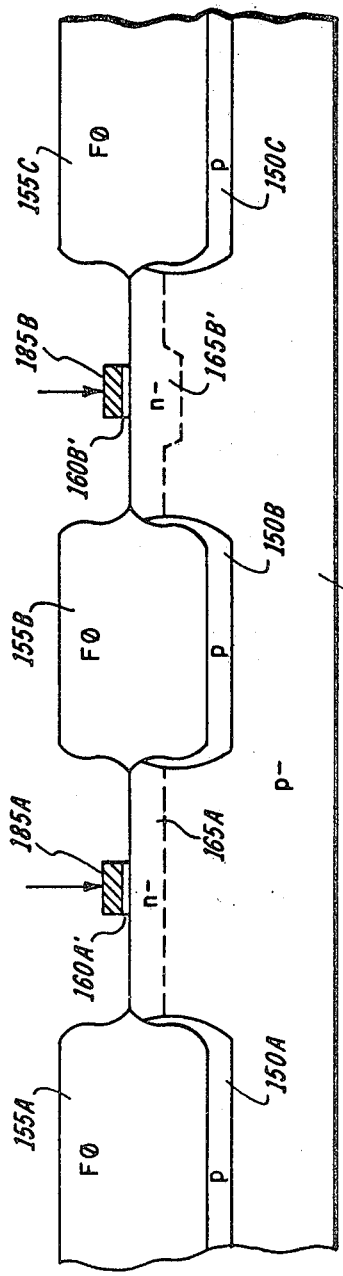

In the third step as shown in FIG. 4D, a gate mask is used to define the narrow gate region to be protected by the silicon nitride 185A–B deposition which is previously applied. The unprotected silicon dioxide areas 160A–B are then etched away leaving only the protected areas, mainly silicon dioxide areas 160A' and 160B' under the silicon nitride areas 185A–B to form a spatially predetermined sandwich thereof.

In the fourth step as shown in FIG. 4E, silicon etching is applied using a plasma-etch process or KOH (or poly-etch) solution to the unprotected areas 187A–D of the N—channel region 165A–B' for removal thereof to approximately a depth of 2000 A.

In the fifth step as shown in FIG. 4F, heavy source and drain implants or introduction of arsenic dopant is used in the N—channel region 165A–B' to create N+ regions in selected areas therein at 190A–B and 195A–B. Subsequently, a polysilicon mask is used to define the circuit pattern in conductive poly-silicon (poly) at areas 200A and 200B as ohmic source contacts and 205A and 205B as ohmic drain contacts through the processes of poly deposition through diffusion then selective poly-etching using the polysilicon mask.

Figure 4G:
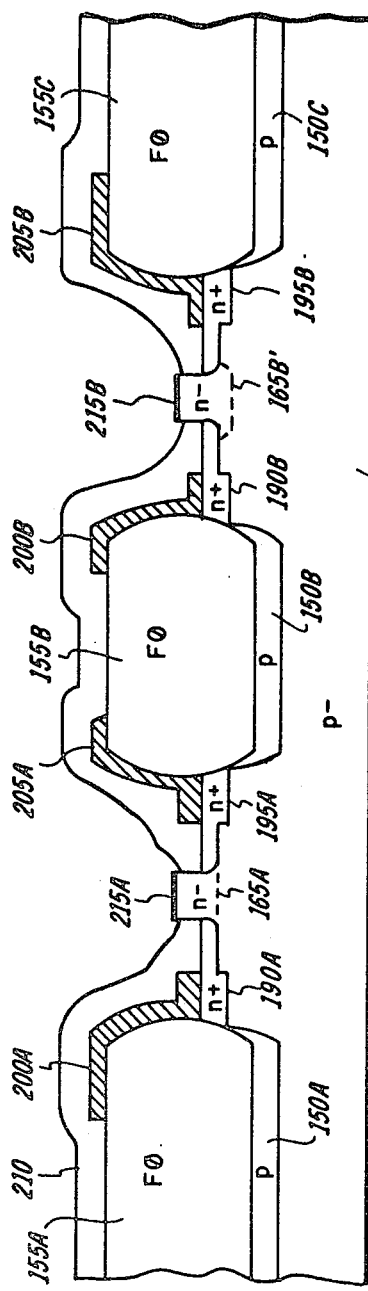

In step six there is shown in FIG. 4G, a second oxidation or reoxidation indicated as 210 over the polysilicon areas 200A–B and 205A–B and also the N+ areas 190A–B and 195A–B and is operative to produce interlayer isolation. Next, the silicon nitride 185A–B and thin silicon oxide 160A'–B' sandwiches are etched away. Replacing the silicon nitride and silicon dioxide, is plantium which is sputteringly deposited at 215A and 215B. Finally, a platinum silicon compound or Schottky or barrier is reactively formed as a Schottky contact at a predetermined temperature for a predetermined time which in this embodiment is 550 degrees C. for 15 minutes in the sputtering vacuum chamber at the same areas 215A–B. A chemical solution is then used that will etch off the unreacted platinum while the platinum silicon 215A–B is unaffected.

Figure 4H:
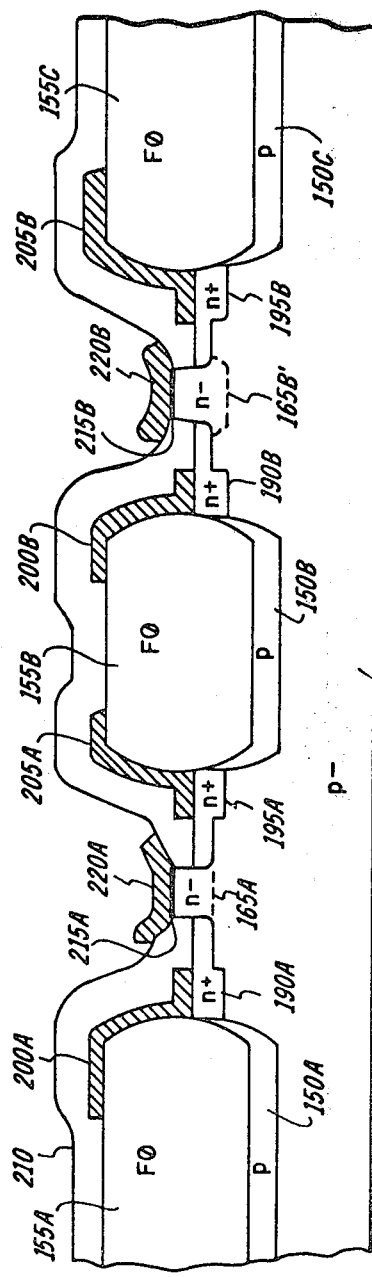

In the seventh step as shown in FIG. 4H, a second layer of metal interconnection which in this embodiment is aluminum is deposited and masked away over the platinum silicon Schottky barrier 215A–B at 220A–B to leave a top metal of 220A–B. The passivation and contact-pad opening steps may be done afterwards as is in a normal MOS-LSI process.

The above process results in fabrication in high-speed, high density, low power LSI circuits with improved high gain MESFET devices using conventional lithographic techniques. The advantages thereof include much improved high device gain as a result of the elimination of series resistance with increased circuit integration density and improved speed capability due to the elimination of gate to source and gate to drain spacings and improved high device gain.

Note that the silicon etching step may be done by using plasma dry etching process, KOH chemical etching solution or polysilicon etching solution. The starting silicon wafers may be of 100, 110, or 111 orientations.

It will be noted that the supra self-aligned MESFET will also function in an equivalent manner if acceptors were to be used where donors are, and donors where acceptors are which is to say that the use of P or N material is equivalent as long as consistent with the above description.

A particular embodiment of the present invention has been described and illustrated, it will be apparent to those skilled in the art that changes and modifications may be made therein without departure from the spirit and scope of the invention as claimed.

What is claimed is:

1. A method of making a self-aligned MESFET having a substrate lightly doped with an acceptor impurity, overlaid with relatively thin first and second areas alternating therewith areas of thick field oxide, with a heavy donor impurity introduced into the substrate below the areas of thick oxide for enhancement switch and depletion load devices, comprising the steps of:

(a) introducing a relatively shallow donor impurity in the substrate below the first and second thin oxide areas to define with graded profiles first and second light donor areas therein;

(b) masking to expose only the second thin oxide area for a relatively deep donor impurity introduction in the second light donor area so that the depletion load device will be normally-on;

(c) layering of an etch resistant mask over the surface of the first and second thin oxide areas to form a sandwich thereof, and masking away to expose first and second light donor areas except for narrowly defined first and second gate sandwiches defined to be over gate channel regions;

(d) etching away the exposed first and second light donor areas to a predetermined depth, and introducing a relatively heavy donor impurity to define, within each of the light donor areas, first and second heavy donor areas as source and drain regions;

(e) depositing polysilicon and etching away, through masking, all but areas that are adjacent to a heavy donor area and a thick oxide area, for defining source and drain ohmic contacts, and reoxidizing over the polysilicon areas and part of first and second heavy donor areas for inter-layer isolation; and (f) etching away first and second gate sandwiches thereby exposing first and second light donor areas, and depositing Schottky metal thereon for reaction into Schottky barrier for use as a Schottky contact.

2. The method of claim 1 including the additional step of depositing top metal over all exposed surfaces of the substrate and masking away all of the top metal except that over the surface of the Schottky contact for defining a gate electrode pattern.

3. The method of claim 1 wherein the donor used in the relatively shallow donor introduction step is arsenic plus.

4. The method of claim 1 wherein the masking of the second thin oxide area step is through depletion masking.

5. The method of claim 1 wherein the donor used in the relatively deep donor introduction step is arsenic plus.

6. The method of claim 1 wherein the etching step used to form the drain and source regions is plasma etching.

7. The method of claim 1 wherein the heavy donor impurity step used to form the heavy donor areas is arsenic.

8. The method of claim 1 wherein the masking step used to define the deposited polysilicon is a polysilicon masking step.

9. The method of claim 1 wherein the metal used in the Schottky metal depositing step is platinum and the reaction is between the platinum and silicon to form a compound thereof.

10. The method of claim 1 including the additional step of removing unreacted Schottky metal from the Schottky metal and silicon compound.

11. The method of claim 2 wherein the metal used in the top metal deposition step is aluminum.

* * * * *